(12) United States Patent
Wang et al.

(10) Patent No.: US 11,398,829 B1
(45) Date of Patent: Jul. 26, 2022

(54) MULTI-CHANNEL DIGITAL TO ANALOG CONVERTER

(71) Applicant: NXP B.V., Eindhoven (NL)

(72) Inventors: RuoXi Wang, Shanghai (CN); Hongyun Zhang, Shanghai (CN); XinDong Duan, Shanghai (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/331,801

(22) Filed: May 27, 2021

(30) Foreign Application Priority Data

May 14, 2021 (CN) .......................... 202110531688.6

(51) Int. Cl.
*H03M 1/66* (2006.01)
(52) U.S. Cl.
CPC ............. *H03M 1/662* (2013.01); *H03M 1/66* (2013.01)
(58) Field of Classification Search
CPC ................................ H03M 1/66; H03M 1/662
USPC .................................................. 341/141, 144
See application file for complete search history.

(56) References Cited

U.S. PATENT DOCUMENTS

| 6,570,516 | B1 | 5/2003 | Barker |
| 6,927,712 | B2 | 8/2005 | Wei |
| 7,193,551 | B2 * | 3/2007 | Chia .................... G09G 3/3696 341/142 |
| 8,487,859 | B2 * | 7/2013 | Kim ..................... G09G 3/3688 345/100 |

* cited by examiner

*Primary Examiner* — Khai M Nguyen
(74) *Attorney, Agent, or Firm* — Lloyd E. Dakin, Jr.

(57) ABSTRACT

A multi-channel digital to analog converter, DAC, comprising: a DAC configured to provide an analog signal comprising a plurality of time division multiplexed sub-signals, each provided for one of a plurality of output channels; wherein each of the output channels include: a sampling capacitor; a selector switch configured to couple the sampling capacitor of the respective output channel to the output terminal of the DAC such that the sampling capacitor samples the analog signal over a plurality of discrete sampling periods; a comparator configured to provide a comparator output signal, wherein the sampling capacitor is coupled to an input terminal of the comparator; and an output control gate configured to control whether or not the comparator output signal is output from the respective output channel at a predetermined time later than a first of the respective plurality of discrete sampling periods.

20 Claims, 2 Drawing Sheets

MULTI-CHANNEL DIGITAL TO ANALOG CONVERTER

CROSS-REFERENCE TO RELATED APPLICATIONS

This application claims the priority under 35 U.S.C. § 119 of China patent application no. 202110531688.6, filed May 14, 2021 the contents of which are incorporated by reference herein.

FIELD

The present disclosure relates to a multi-channel digital to analog converter, DAC.

BACKGROUND

A multi-channel DAC is configured to receive a digital signal and provide a plurality of analog signals based on said digital signal via a corresponding plurality of output channels.

SUMMARY

According to a first aspect of the present disclosure there is provided a multi-channel digital to analog converter, DAC, comprising:
  a DAC having an input terminal to receive a digital input signal and an output terminal configured to provide an analog signal comprising a plurality of sub-signals that are time division multiplexed in the analog signal, each of the sub-signals provided for a respective one of a plurality of output channels;
  wherein each of the plurality of output channels include:
    a sampling capacitor;
    a selector switch configured to, based on a respective selector switch signal, couple the sampling capacitor of the respective output channel to the output terminal of the DAC such that the sampling capacitor samples the analog signal over a plurality of discrete sampling periods corresponding to times the sub-signal for the respective output channel is present in the analog signal;
    a comparator configured to provide a comparator output signal based at least on a voltage of the respective sampling capacitor and a comparator reference voltage, wherein the sampling capacitor is coupled to an input terminal of the comparator; and
    an output control gate configured to control whether or not the comparator output signal is output from the respective output channel based on a gate signal; and
  a controller configured to, for each of said output channels, during the provision of an output channel enable signal for a respective one of the output channels, provide the selector switch signal for the respective one of said output channels to provide for said plurality of discrete sampling periods and provide the gate signal for the respective one of said output channels to allow the output from the respective one of the output channels at a predetermined time later than a first of the respective plurality of discrete sampling periods.

In one or more embodiments, the predetermined time is such that the gate signal is provided at a time after a first of the plurality of discrete sampling periods and before at least a fifth of the plurality of discrete sampling periods.

In one or more embodiments, the controller is configured to provide the gate signal in response to a second of the plurality of discrete sampling periods.

In one or more embodiments, the controller is configured to provide the gate signal in response to an end of a second of the plurality of discrete sampling periods.

In one or more embodiments, each of the comparators comprise a supply voltage terminal configured to receive a comparator supply voltage to enable the comparator to provide its comparator output signal; and
  wherein the controller is configured to provide the comparator supply voltage for a respective comparator at a time after a first of the plurality of discrete sampling periods.

In one or more embodiments, the controller is configured such that the gate signal for the respective one of the output channels is provided later than the comparator supply voltage for the respective one of the output channels.

In one or more embodiments, the controller is configured to, based on a change in the output channel enable signal to disable the respective output channel, provide for a change in the respective gate signal such that the comparator output signal is not output from the respective output channel.

In one or more embodiments, the controller is configured to, based on a change in the output channel enable signal to disable the respective output channel, not provide the comparator supply voltage to thereby disable the comparator such that it does not provide its comparator output signal.

In one or more embodiments, said output control gate is provided by an AND logic gate arrangement having a first input terminal configured to receive the comparator output signal from the respective comparator and a second input terminal configured to receive the respective gate signal and an output terminal comprising the output from the respective output channel.

In one or more embodiments, said sampling capacitor comprises a first plate coupled to both the respective selector switch and the respective comparator and a second plate configured to be coupled to a reference voltage.

According to a second aspect of the present disclosure there is provided a method for operating a multi-channel digital to analog converter, DAC, comprising, the DAC comprising an input terminal to receive a digital input signal and an output terminal configured to provide an analog signal comprising a plurality of sub-signals that are time division multiplexed in the analog signal, each of the sub-signals provided for a respective one of a plurality of output channels; and wherein each of the plurality of output channels include a sampling capacitor, a selector switch, a comparator configured to provide a comparator output signal based at least on a voltage of the respective sampling capacitor and a comparator reference voltage, wherein the sampling capacitor is coupled to an input terminal of the comparator, and an output control gate configured to control whether or not the comparator output signal is output from the respective output channel based on a gate signal;
  the method comprising, for at least one of the output channels:
  receiving, by a controller, an output channel enable signal, and, in response to said output channel enable signal, providing, by the controller, a selector switch signal to couple the sampling capacitor of the respective output channel to the output terminal of the DAC such that the sampling capacitor repeatedly samples the analog signal over a plurality of discrete sampling periods corresponding to times the sub-signal for the respective output channel is present in the analog signal; and providing the gate signal for the at least one of the output channels to allow the output from the at least one of the output channels at a predetermined time later than a first of the plurality of discrete sampling periods.

In one or more embodiments, the method includes:
determining the end of a second of the discrete sampling period; and
the step of providing the gate signal comprises providing the gate signal in response to the end of the second of the plurality of discrete sampling period.

In one or more embodiments, each of the comparators comprise a supply voltage terminal configured to receive a comparator supply voltage to enable the comparator to provide its comparator output signal; and the method includes, for said at least one of the output channels:
providing the comparator supply voltage at a time after a first of the plurality of discrete sampling periods.

In one or more embodiments, the gate signal for the output channel is provided later than the comparator supply voltage for the output channel.

In one or more embodiments, the method includes:
based on a change in the output channel enable signal to disable the respective output channel, providing for a change in the respective gate signal such that the comparator output signal is not output from the respective output channel.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A multi-channel digital to analog converter, DAC, receives a digital signal and is configured to output a plurality of analog signals over a corresponding plurality of output channels.

Figure 1:
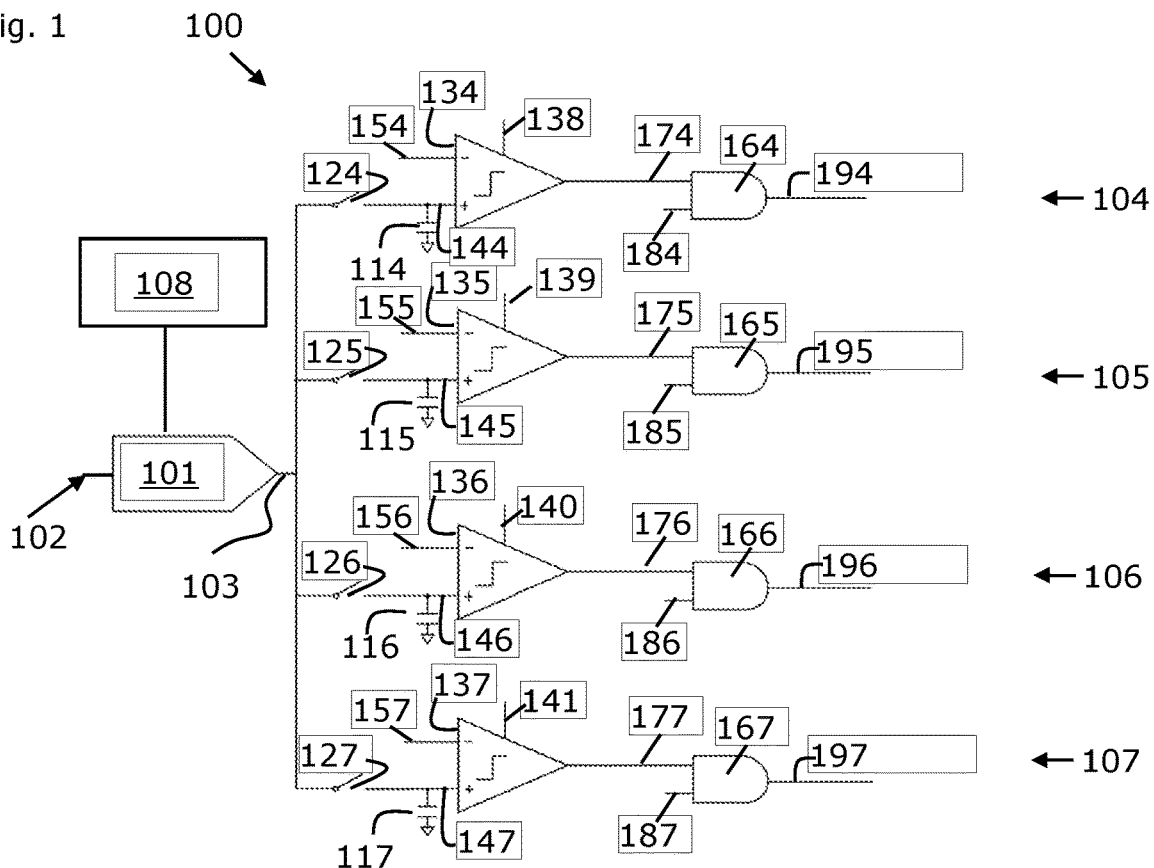
FIG. 1 shows an example embodiment of a multi-channel digital to analog converter, DAC.

Example FIG. 1 shows an embodiment of a multi-channel digital to analog converter, DAC, 100 comprising a DAC 101 having an input terminal 102 to receive a digital input signal and an output terminal 103 configured to provide an analog signal comprising a plurality of sub-signals that are time division multiplexed in the analog signal. Each of the sub-signals are provided for a respective one of a plurality of output channels 104, 105, 106 and 107. It will be appreciated that at any one time one, some or all of the output channels 104, 105, 106, 107 may be enabled such that they provide an output signal. Thus, the analog signal from the DAC at output terminal 103 may include a sub-signal for each and every output channel 104, 105, 106 and 107. At other times, the analog signal from the DAC at output terminal 103 may include sub-signals for only one or a subset of the output channels 104, 105, 106 and 107. The principles of the control of the multi-channel DAC described herein apply per output channel and therefore irrespective of which output channels are enabled at any one time, the principles described herein may be applied.

Each of the plurality of output channels 104, 105, 106, 107 include a sampling capacitor 114, 115, 116, 117 respectively.

Each of the plurality of output channels 104, 105, 106, 107 include a selector switch 124, 125, 126, 127. The selector switches are configured to connect the corresponding sampling capacitor 114, 115, 116, 117 to the output of the DAC 101 to sample the output of the DAC at particular sampling times such that the sampling capacitor 114, 115, 116, 117 receives the analog signal during its associated time slice of the time division multiplexed analog signal. Thus, in one or more examples, only one of the selector switches 124, 125, 126, 127 may be closed at any one time. The operation of the selector switches is typically synchronised with time slices or periods of the time division multiplexed analog signal.

Accordingly, the multichannel DAC 100 is configured such that each of the selector switches 124, 125, 126, 127 is individually controlled by a respective selector switch signal. Thus, each of the selector switches 124, 125, 126, 127 is respectively configured to, based on its selector switch signal, repeatedly couple the sampling capacitor 114, 115, 116, 117 of the respective output channel to the output terminal 103 of the DAC such that the sampling capacitor samples the analog signal over a plurality of discrete sampling periods corresponding to a plurality of times the sub-signal for the respective output channel is present in the analog signal. Accordingly, the selector switch signal will cause the selector switch 124, 125, 126, 127 to close during the sampling periods to couple the sampling capacitor to the output of the DAC and open outside the sampling periods to disconnect the sampling capacitor from the output of the DAC. During times the selector switch of one of the output channels is open, the sampling switches of the other output channels may be closed (typically not simultaneously closed) to sample the output of the DAC at their respective discrete sampling times.

Each of the plurality of output channels 104, 105, 106, 107 include a comparator 134, 135, 136, 137. Each comparator 134, 135, 136, 137 is configured to provide a comparator output signal based at least on a voltage of the respective sampling capacitor 114, 115, 116, 117 and a comparator reference voltage. Thus, the sampling capacitor is coupled to an input terminal 144, 145, 146, 147 of the comparator 134, 135, 136, 137. A second input terminal 154, 155, 156, 157 is configured to receive the comparator reference voltage. The comparator may be of the form of an operational amplifier and the input terminals 144, 145, 146, 147 may comprise a non-inverting input terminal. The second input terminals 154, 155, 156, 157 may comprise inverting input terminals. In one or more examples, the comparator reference voltage may be a signal with which to make a comparison, such as a current level through device, a voltage level on a device pin, or a signal representing the temperature of a device among many others. The comparator reference voltage may be the same or different for each of the comparators 134, 135, 136, 137. In one or more examples, the comparator reference voltage may be provided by the multichannel DAC 100, the DAC 101 or the controller 108. In other examples, the comparator reference voltage may be provided by a device external to the multichannel DAC 100.

The sampling capacitors 114, 115, 116, 117 thus comprises a first plate coupled to both the respective selector switch 124, 125, 126, 127 and the respective input terminal 144, 145, 146, 147 of the respective comparator 134, 135, 136, 137 and a second plate is configured to be coupled to a reference voltage, shown as ground in FIG. 1.

An output terminal of each of the comparators 134, 135, 136, 137 is coupled to a respective output control gate 164, 165, 166, 167. The output control gates are configured to control whether or not the comparator output signal is output from the respective output channel 104, 105, 106, 107. The control of whether the output control gate 164, 165, 166, 167 provides a blocking or allowing action is based on a respective gate signal for that output control gate. Thus, the output control gates 164, 165, 166, 167 are individually controllable based on their respective gate signal.

The output control gate may be provided by any element that can allow or block the output of the comparator and thereby control whether or not an output is provided from the output channel 104, 105, 106, 107. For example, the output control gate may comprise a switch. However, in the present example, the output control gates are provided by AND logic gate arrangements. The AND gates have a first input terminal 174, 175, 176, 177 configured to receive the comparator output signal from the respective comparator 134, 135, 136, 137. The AND gate has a second input terminal 184, 185, 186, 187 configured to receive the respective gate signal and an output terminal 194, 195, 196, 197 comprising the output from the respective output channel. Thus, when both corresponding gate signals and the output from the comparators are logic high, an output from the output channel is provided at the respective output 194, 195, 196 and 197 of the output channel. When either is low, the output control gate 164, 165, 166, 167 blocks the output from the respective output channel 104, 105, 106, 107.

The multi-channel DAC further comprises a controller 108 for providing the respective gate signals. The controller 108 may be configured to also provide the selector switch signals. In some examples, the controller 108 does not provide the selector switch signal but simply monitors the selector switch signals provided to the selector switches 124, 125, 126, 127.

In this example, the controller 108 is configured to control the gate signal for a particular one of the output channels 104, 105, 106, 107 based on that particular output channel being enabled in that it is actively sampling the output of the DAC 101 by virtue of the opening and closing of the corresponding selector switch 124, 125, 126, 127 at the required times. Thus, the process described may be applied equally to each of the output channels 104, 105, 106, 107.

Each of the output channels 104, 105, 106, 107 may be enabled or disabled. When enabled, the selector switch signal of the output channel is provided to enable the sampling of the analog signal from the DAC by the sampling capacitor 114, 115, 116, 117. When disabled, the selector switch signal of the output channel is not provided, such as when a sub-signal for that output channel is not present in the analog signal output from the DAC 101.

Thus, for each of said output channels 104, 105, 106, 107, the controller 108 is configured such that during the provision of an output channel enable signal for a respective one of the output channels, it provides the selector switch signal for the respective one of said output channels to provide for said plurality of discrete sampling periods.

Figure 2:
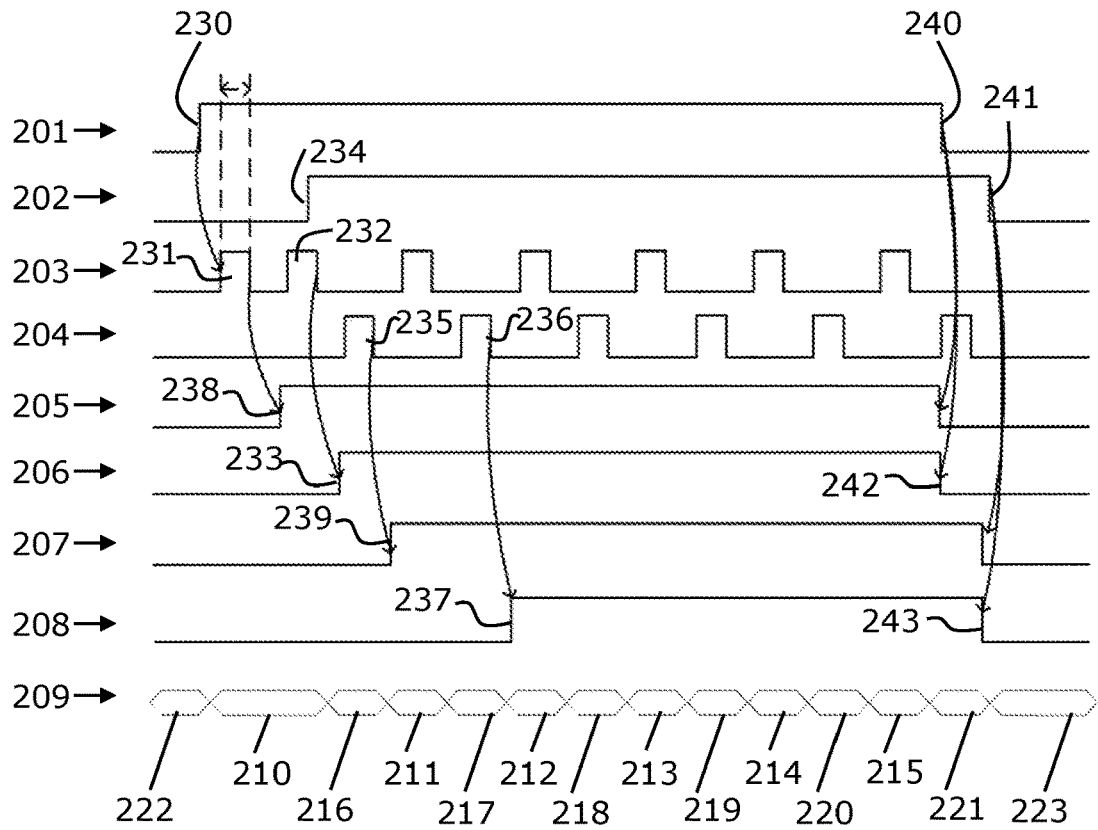
FIG. 2 shows an example timing diagram illustrating an example operation of said multi-channel digital to analog converter, DAC.

With reference to example FIG. 2, the timing diagram illustrates the signals provided by the controller 108 and, in some examples, other entities (not shown). Trace 201 shows an output channel enable signal for a first output channel, for example output channel 104. Trace 202 shows an output channel enable signal for a second output channel, for example output channel 105. Thus, in this example, the status of the output channels 106, 107 are currently non-active or "disabled".

Trace 203 shows the selector switch signal for the first output channel, for example the output channel 104. Each logic high period (could be logic low in other examples) represent a time in which the sampling capacitor is coupled to the DAC 101. Trace 204 shows the selector switch signal for the second output channel, for example the output channel 105. Each logic high period (could be logic low in other examples) represent a time in which the sampling capacitor is coupled to the DAC 101. Trace 206 shows the gate signal for the first output channel, for example the output channel 104. Trace 208 shows the gate signal for the second output channel, for example the output channel 105.

Trace 209 shows the digital input signal to the DAC 101 provided at 102. The trace 209 is also representative, to an extent, of the analog output signal at 103. The parts of the signal at 210-215 represent one sub-signal divided into time slices. The parts of the signal at 216-221 represent a different sub-signal divided into time slices. As will be appreciated that the parts 210-215 and parts 216-221 are interleaved in time-divisional multiplexed fashion. The parts 210-215 are for the first of the output channels 104 and the parts 216-221 are for the second of the output channels 105. Parts 222 and 223 represent parts without data for the output channels 104-107.

Thus, data portion 210 represent a time of the first part of the first sub-signal. The state of the output channel enable signal 201 for the first output channel 103 is changed at 230 to enable the first output channel 103. The output channel enable signal 201 may be a signal internal to the controller 108 or may be generated by a different entity (not shown). During the provision of a (high in this example) output channel enable signal 201, the controller 108 is configured to provide the selector switch signal 203 for the respective first output channel 103 to provide for said plurality of discrete sampling periods 231, 232 (only the first two discrete sampling periods are labelled) etc. As will be appreciated, the timing of the discrete sampling periods are time-aligned with the time division multiplexed analog signal output by the DAC 101.

The controller 108 is configured to provide the gate signal 206 for the first output channel 104, to allow (unblock) the output from first output channel 104, at a predetermined time later than a first 231 of the sampling periods. For example, later than an end of the first 231 of the sampling periods. Thus, it can be seen in FIG. 2 that the gate signal 206 changes state to permit output from the output channel 103 at time 233, which is after the time of the first sample period 231.

Accordingly, until the gate signal is provided, the output from the respective output channel 103 is blocked. In one or more examples, this has been found to provide time for the output signal from the comparator 134 to settle before the output from the comparator 134 at the terminal 174 of the gate 164 is provided as the output at 194 from the respective output channel 103.

Likewise, if we now consider the second output channel 105, the data portion 216 represents a time of a first part of the second sub-signal. The state of the output channel enable signal 202 for the second output channel 104 is changed at 234 to enable the second output channel 104. The output channel enable signal 202 may be a signal internal to the controller 108 or may be generated by a different entity (not shown). During the provision of a (high in this example) output channel enable signal 202, the controller 108 is configured to provide the selector switch signal 204 for the respective second output channel 104 to provide for said plurality of discrete sampling periods 235, 236 (only the first two discrete sampling periods are labelled) etc. As will be appreciated, the timing of the discrete sampling periods are time-aligned with the time division multiplexed analog signal output by the DAC 101, namely at times of the second sub-signal 216-221.

The controller 108 is configured to provide the gate signal 208 for the gate 165 of the second output channel 105, to allow (unblock) the output from second output channel 105, at a predetermined time later than a first 235 of the sampling periods (e.g. later than an end of the first 325 sampling period). Thus, it can be seen in FIG. 2 that the gate signal 208 changes state to permit output from the output channel 103 at time 237, which is after the time of the first sample period 235 for the second output channel 105.

In one or more examples the predetermined time is such that the gate signal is provided at a time after the first 231, 235 of the sampling periods and before at least a fifth of the sampling periods in any period in which the output channel is "enabled".

Thus, while the output channel enable signal 201, 202 for the respective output channel is present, the controller 108, by way of the gate signal 206, 208 being provided at said time later than a first of the respective sampling periods, effectively blocks the output from the output channel 103, 104 until a time after the first, second, third, or fourth of the sampling periods, for example.

In the example shown in example FIG. 2, the controller 108 is configured to provide the gate signal 206, 208 in response to the second sampling period 232, 236. In particular, the controller is configured to provide the gate signal in response to the end of the second sampling period 232, 236.

Thus, the controller 108 may be configured to detect the edge (which is in this example a falling edge) of the end of the second sampling period 232, 236. This falling edge, for example, may be configured to trigger logic within the controller 108 to cause the provision of the gate signal 233.

Thus, the controller 108 may comprise edge detection module configured to detect edges (rising or falling or both) associated with the sampling periods and a counter to count a predetermined of edges before providing for said gate signal to change from blocking the output from the output channel to allowing the output from the output channel. In other examples, the controller 108 may include a timer configured to wait a predetermined amount of time from time 230 to time 233 or, for the second output channel 105, from time 234 to time 237.

In the present example of FIG. 1, the comparators 134, 135, 136, 137 comprise supply voltage terminals 138, 139, 140, 141 to receive a signal comprising the supply voltage for the respective comparator that enables it to operate. For example, without the supply voltage the comparator may not output a signal or may not output a valid signal to terminal 174, 175, 176, 177. Thus, the comparators 134, 135, 136, 137 are configured to receive a comparator supply voltage to enable the comparator to provide its comparator output signal.

The controller 108 may be configured to provide the comparator supply voltage for a respective comparator at a time after a first 231, 235 of the sampling periods.

With reference to example FIG. 2, trace 205 shows the comparator supply voltage signal for the first comparator 134, provided at terminal 138. Trace 207 shows the comparator supply voltage signal for the second comparator 135, provided at terminal 139. In this example, the comparator supply voltage signal for the first comparator 134 is provided at time 238. In this example, the comparator supply voltage signal for the second comparator 135 is provided at time 239.

In this and other examples, the controller 108 may be configured to provide the comparator supply voltage signal in response to the end (e.g. the falling edge of) the first sampling period 231, 235.

In general, the gate signal for the respective one of the output channels is provided later than the comparator supply voltage for the respective one of the output channels. Accordingly, the sampling capacitor will be "refreshed" from the output of the DAC and the current draw of the comparator has time to settle before the output from the output channel is permitted by the provision of the gate signal. It has been found that the comparators draw large amounts of charge from the capacitor and DAC when it starts-up, which would require the DAC to have a large drive capability to maintain the output voltage.

With reference to trace 201, time 240 shows the end of the output channel enable signal for the first output channel 103. Thus, time 240 may be considered to comprise the output channel enable signal for the first output channel 103 disabling the first output channel 104. Likewise, time 241 shows the end of the output channel enable signal for the second output channel 104. The end of the enable signal corresponds to the time the input to the DAC (and therefore the output from the DAC) stops providing the sub-signal for the output channel. Thus, for the first output channel 103, the final time slice is part 215. Thus, for the second output channel 104, the final time slice is part 221.

Thus, the controller 108 may be configured to, based on a change (at time 240 or time 241) in the output channel enable signal 201, 202 to disable the respective output channel 103, 104, provide for a change 242, 243 in the respective gate signal such that the comparator output signal is not output from the respective output channel 103, 104. Thus, the output control gate returns to blocking output from the output channel.

When the output channel is disabled, the comparator supply voltage may also be withdrawn. Thus, the controller 108 may be configured to, based on a change in the output channel enable signal at times 240 or 241 to disable the respective output channel 103 or 104, not provide (transition from providing to not providing) the comparator supply voltage at times 242 or 243 to thereby disable the comparator 134, 135 such that it does not provide its comparator output signal (or a valid signal) to the input terminal of the AND logic 164 or 165.

Figure 3:
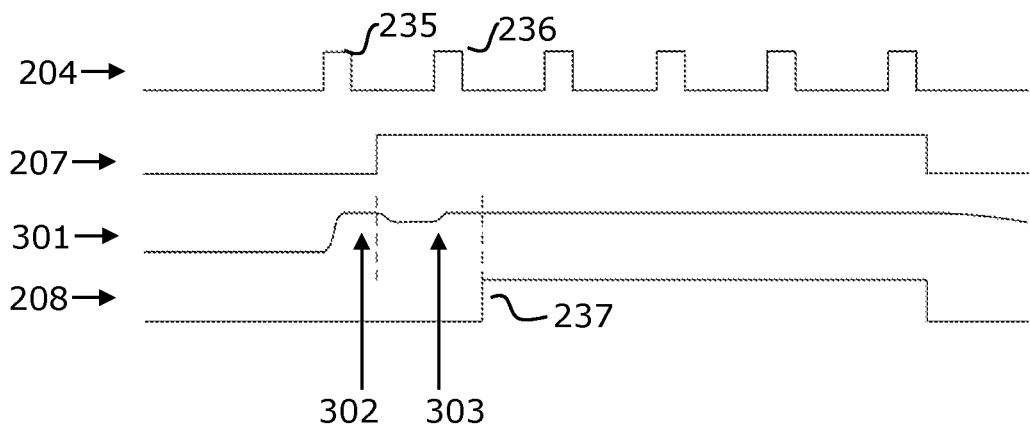
FIG. 3 shows an example timing diagram illustrating a glitch.

Example FIG. 3 is similar to example FIG. 2 but includes a trace 301 which shows the voltage level of the signal input 145 to the comparator 135. A comparison based on this signal at 145 will, if not blocked by the output control gate 165, be output from the second output channel 104. Traces 204, 207, and 208 are reproduced in FIG. 3. It can be seen that at time 302, corresponding to the first sample period 235, the sampling capacitor is charging leading to a variable output voltage 301. At time 303, the comparator supply voltage is provided and there is a temporary reduction in the output voltage 301 as the comparator draws current. A parasitic capacitance formed between the sampling capacitor and the input of the comparator may cause the variation in voltage. However, at time 237 when the gate signal unblocks the output channel 104, the voltage in trace 301 is stable. Thus, the output control gates 164, 165, 166, 167 and control as described herein may, in one or more embodiments, provide a multichannel DAC having a more consistent output voltage.

Figure 4:
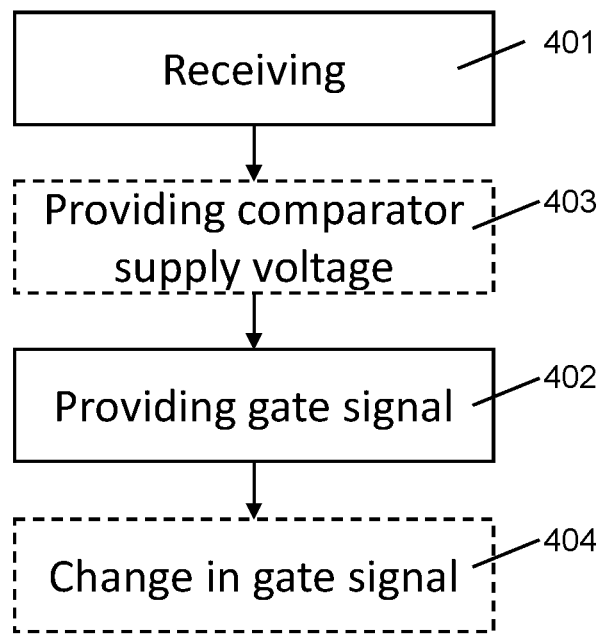
FIG. 4 shows a flowchart illustrating an example embodiment of a method of controlling a multi-channel digital to analog converter, DAC.

Example FIG. 4 shows a method for operating a multi-channel digital to analog converter, DAC 100.

The method comprises, for any one of the output channels 104 (using the first output channel as an example): receiving 401, by the controller 108, an output channel enable signal 201, and, in response to said output channel enable signal, providing, by the controller 108, a selector switch signal 203 to couple the sampling capacitor 114 of the respective output channel 104 to the output terminal 103 of the DAC 101 such that the sampling capacitor 114 repeatedly samples the analog signal over a plurality of discrete sampling periods 231, 232 corresponding to times the sub-signal for the respective output channel 104 is present in the analog signal.

The method further comprises providing 402 the gate signal 206 for the at least one of the output channels 103 to allow the output from the at least one of the output channels 104 at a predetermined time later than a first 231 of the sampling periods. For example, later than an end of the first 231 sampling periods.

The method, in step 402, may further include determining the end of a second of the discrete sampling period 232 and, in step 402, providing the gate signal in response to the end of the second 232 of the discrete sampling periods.

The method may include an optional intermediate step 403 comprising providing the comparator supply voltage at a time after a first 231 of the sampling periods. In this example, the provision of the gate signal in step 402 for the output channel is provided later than the comparator supply voltage in step 403.

As described above, the method may include an optional step 404 comprising based on a change in an output channel enable signal to disable the respective output channel 104, providing for a change in the respective gate signal such that the comparator output signal is not output from the respective output channel 104.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A multi-channel digital to analog converter, DAC, comprising:
 a DAC having an input terminal to receive a digital input signal and an output terminal configured to provide an analog signal comprising a plurality of sub-signals that are time division multiplexed in the analog signal, each of the sub-signals provided for a respective one of a plurality of output channels;
 wherein each of the plurality of output channels include:
  a sampling capacitor;
  a selector switch configured to, based on a respective selector switch signal, couple the sampling capacitor of the respective output channel to the output terminal of the DAC such that the sampling capacitor samples the analog signal over a plurality of discrete sampling periods corresponding to times the sub-signal for the respective output channel is present in the analog signal;

a comparator configured to provide a comparator output signal based at least on a voltage of the respective sampling capacitor and a comparator reference voltage, wherein the sampling capacitor is coupled to an input terminal of the comparator; and an output control gate configured to control whether or not the comparator output signal is output from the respective output channel based on a gate signal; and a controller configured to, for each of said output channels, during the provision of an output channel enable signal for a respective one of the output channels, provide the selector switch signal for the respective one of said output channels to provide for said plurality of discrete sampling periods and provide the gate signal for the respective one of said output channels to allow the output from the respective one of the output channels at a predetermined time later than a first of the respective plurality of discrete sampling periods.

2. The multi-channel DAC of claim 1, wherein the predetermined time is such that the gate signal is provided at a time after a first of the plurality of discrete sampling periods and before at least a fifth of the plurality of discrete sampling periods.

3. The multi-channel DAC of claim 1, wherein the controller is configured to provide the gate signal in response to a second of the plurality of discrete sampling periods.

4. The multi-channel DAC of claim 1, wherein the controller is configured to provide the gate signal in response to an end of a second of the plurality of discrete sampling periods.

5. The multi-channel DAC of claim 1, wherein each of the comparators comprise a supply voltage terminal configured to receive a comparator supply voltage to enable the comparator to provide its comparator output signal; and wherein the controller is configured to provide the comparator supply voltage for a respective comparator at a time after a first of the plurality of discrete sampling periods.

6. The multi-channel DAC of claim 5, wherein the controller is configured such that the gate signal for the respective one of the output channels is provided later than the comparator supply voltage for the respective one of the output channels.

7. The multi-channel DAC of claim 1, wherein the controller is configured to, based on a change in the output channel enable signal to disable the respective output channel, provide for a change in the respective gate signal such that the comparator output signal is not output from the respective output channel.

8. The multi-channel DAC of claim 5, wherein the controller is configured to, based on a change in the output channel enable signal to disable the respective output channel, not provide the comparator supply voltage to thereby disable the comparator such that it does not provide its comparator output signal.

9. The multi-channel DAC of claim 1, wherein said output control gate is provided by an AND logic gate arrangement having a first input terminal configured to receive the comparator output signal from the respective comparator and a second input terminal configured to receive the respective gate signal and an output terminal comprising the output from the respective output channel.

10. The multi-channel DAC of claim 1, wherein said sampling capacitor comprises a first plate coupled to both the respective selector switch and the respective comparator and a second plate configured to be coupled to a reference voltage.

11. The multi-channel DAC of claim 1, wherein said comparator reference voltage comprises a voltage generated by the multi-channel DAC.

12. The multi-channel DAC of claim 1, wherein the comparator comprises an amplifier having an inverting input to receive the voltage of the sampling capacitor and a non-inverting input to receive the comparator reference voltage.

13. A method for operating a multi-channel digital to analog converter, DAC, comprising, the DAC comprising an input terminal to receive a digital input signal and an output terminal configured to provide an analog signal comprising a plurality of sub-signals that are time division multiplexed in the analog signal, each of the sub-signals provided for a respective one of a plurality of output channels; and wherein each of the plurality of output channels include a sampling capacitor, a selector switch, a comparator configured to provide a comparator output signal based at least on a voltage of the respective sampling capacitor and a comparator reference voltage, wherein the sampling capacitor is coupled to an input terminal of the comparator, and an output control gate configured to control whether or not the comparator output signal is output from the respective output channel based on a gate signal;

the method comprising, for at least one of the output channels;

receiving, by a controller, an output channel enable signal, and, in response to said output channel enable signal, providing, by the controller, a selector switch signal to couple the sampling capacitor of the respective output channel to the output terminal of the DAC such that the sampling capacitor repeatedly samples the analog signal over a plurality of discrete sampling periods corresponding to times the sub-signal for the respective output channel is present in the analog signal, and providing the gate signal for the at least one of the output channels to allow the output from the at least one of the output channels at a predetermined time later than a first of the plurality of discrete sampling periods.

14. The method of claim 13, wherein the method includes determining the end of a second of the discrete sampling period; and the step of providing the gate signal comprises providing the gate signal in response to the end of the second of the plurality of discrete sampling period.

15. The method of claim 13, wherein each of the comparator comprise a supply voltage terminal configured to receive a comparator supply voltage to enable the comparator to provide its comparator output signal, and the method includes, for said at least one of the output channels;

providing the comparator supply voltage at a time after a first of the plurality of discrete sampling periods.

16. The method of claim 15, wherein the gate signal for the output channel is provided later than the comparator supply voltage for the output channel.

17. The method of claim 13 wherein the method includes:
based on a change in the output channel enable signal to disable the respective output channel, providing for a change in the respective gate signal such that the comparator output signal is not output from the respective output channel.

18. The method of claim 15, wherein the method includes, based on a change in the output channel enable signal to disable the respective output channel, not providing the comparator supply voltage to thereby disable the comparator such that it does not provide its comparator output signal.

19. The method of claim 13, wherein said output control gate is provided by an AND logic gate arrangement having a first input terminal configured to receive the comparator output signal from the respective comparator and a second input terminal configured to receive the respective gate signal and an output terminal comprising the output from the respective output channel.

20. The method of claim 13, wherein said sampling capacitor comprises a first plate coupled to both the respective selector switch and the respective comparator and a second plate configured to be coupled to a reference voltage.

\* \* \* \* \*